US010395722B2

(12) United States Patent
Cox et al.

(10) Patent No.: US 10,395,722 B2
(45) Date of Patent: Aug. 27, 2019

(54) READING FROM A MODE REGISTER HAVING DIFFERENT READ AND WRITE TIMING

(71) Applicant: Intel Corporation, Santa Clara, CA (US)

(72) Inventors: Christopher E. Cox, Placerville, CA (US); Bill Nale, Livermore, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/721,052

(22) Filed: Sep. 29, 2017

(65) Prior Publication Data

US 2019/0103154 A1    Apr. 4, 2019

(51) Int. Cl.

| G11C 8/18 | (2006.01) |
|---|---|
| G11C 11/4076 | (2006.01) |
| G06F 12/06 | (2006.01) |
| G11C 7/22 | (2006.01) |
| G11C 11/409 | (2006.01) |

(Continued)

(52) U.S. Cl.
CPC ...... *G11C 11/4076* (2013.01); *G06F 12/0623* (2013.01); *G06F 12/0646* (2013.01); *G06F 13/1673* (2013.01); *G11C 7/1045* (2013.01); *G11C 7/1051* (2013.01); *G11C 7/1072* (2013.01); *G11C 7/227* (2013.01); *G11C 8/06* (2013.01); *G11C 11/409* (2013.01)

(58) Field of Classification Search
CPC ............ G11C 11/4076; G11C 11/4082; G11C 11/4093; G11C 5/04; G11C 7/1051; G11C 7/1078; G11C 7/22
See application file for complete search history.

(56) References Cited

U.S. PATENT DOCUMENTS

| 5,379,382 A * | 1/1995 | Work ..................... G06F 13/385 703/25 |
|---|---|---|
| 5,751,975 A | 5/1998 | Gillespie et al. |

(Continued)

OTHER PUBLICATIONS

Denzil Rogers: "DDR2 SDRAM", Jan. 1, 2004 (Jan. 1, 2004),URL:https://www.micron.com/media/client/global/documents/products/data-sheet/dram/ ddr2/512mbddr2.pdf, [retrieved on Jan. 21, 2019] * p. 79; figure 36 * 135 pages.

(Continued)

*Primary Examiner* — Thong Q Le
(74) *Attorney, Agent, or Firm* — Compass IP Law PC

(57) ABSTRACT

A system provides a mailbox communication register for communication between a host and a mode register. The mode register is to store configuration information, and write of configuration information to the mode register by the host takes less time than a read of the configuration information from the mode register by the host. The communication register is separate from the mode register and provides a location to store the configuration information for a read by the host. In response to a read request by the host, the mode register can copy the configuration information to the communication register and allow the host to read the register based on different timing rules than those that apply to the mode register. Instead of reading directly from a register that has timing variance between read and write, the host can read from a communication register.

25 Claims, 8 Drawing Sheets

(51) Int. Cl.
*G06F 13/16* (2006.01)
*G11C 7/10* (2006.01)
*G11C 8/06* (2006.01)

(56) References Cited

U.S. PATENT DOCUMENTS

| | | |
|---|---|---|
| 5,884,027 A | 3/1999 | Garbus et al. |
| 5,930,482 A | 7/1999 | Carter et al. |
| 5,973,988 A | 10/1999 | Nakahira et al. |
| 6,748,478 B1 | 6/2004 | Burke et al. |
| 7,408,981 B2 * | 8/2008 | Chen .................. H04L 1/20 375/229 |
| 2005/0268195 A1 * | 12/2005 | Lund .................. G06F 11/3648 714/741 |
| 2010/0027358 A1 | 2/2010 | Lee |
| 2012/0163099 A1 | 6/2012 | Lee |
| 2013/0282991 A1 | 10/2013 | Ruberg et al. |

OTHER PUBLICATIONS

Extended European Search Report for Patent Application No. 18191347.6, dated Jan. 28, 2019, 11 pages.
V. Rajaraman et al: "Buffered stack memory organisation", Electronics Letters, vol. 11, No. 14, Jan. 1, 1975 (Jan. 1, 1975), p. 305. 3 pages.

* cited by examiner

READING FROM A MODE REGISTER HAVING DIFFERENT READ AND WRITE TIMING

FIELD

The descriptions are generally related to memory devices, and more particular descriptions are related to reading configuration information from configuration registers of a memory device.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2017, Intel Corporation, All Rights Reserved.

BACKGROUND

Memory devices include storage locations for configuration information to set optional or configurable operations of the memory device. The storage locations can be referred to as configuration registers, and are frequently referred to as mode registers. The different configurations can change the operational mode of the memory device. Configurable operation of the memory device can include settings related to speed of communication, timing settings, termination settings, or others, or a combination.

Traditionally mode registers are located in close proximity to each other, and have similar read and write times. Typically mode registers are read and written by the same data bus used to access the memory array of user data. When a mode register is placed in a different location, additional logic circuits may be required to ensure that the read or write times or both are the same or within a range of read and write times for mode registers. The additional logic circuitry results in increased design and implementation costs. Reducing the amount of logic can result in a mode register that has different read and write times. For example, implementing logic to enable the writing or configuring of the mode registers within expected timings, but not implementing the logic to enable the reading of the mode registers within expected timings can result in a memory device with a mode register that has a read time slower than the write time. Differences in read and write timing can complicate the access to the mode register.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic, or a combination, included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
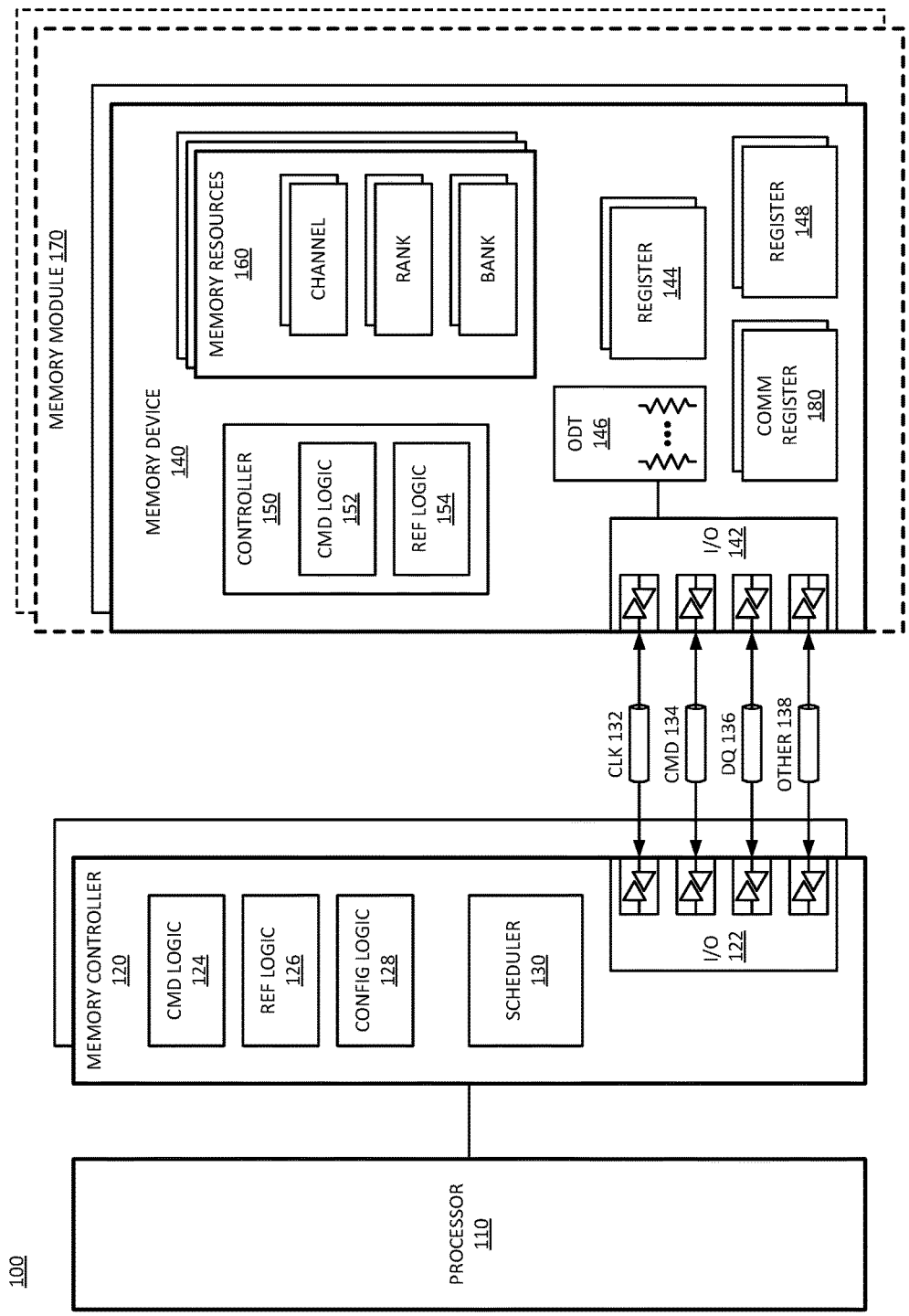
FIG. 1 is a block diagram of an embodiment of a memory subsystem in which a mode register can be read through a communication register.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a system provides a mailbox communication register for communication between a host and a mode register or configuration register. A mode register refers to a register or addressable storage location for storing configuration information for the memory device, and can alternatively be referred to as a configuration register or configuration storage location. The configuration information controls the operations of the memory device, rather than being user data or data for use by or execution by a host processor. A mode can refer to operation of the memory device with a specific configuration to enable certain capabilities or set the parameters of operation of enabled capabilities.

With increasing memory device capabilities, the number of mode registers also tends to increase, as more configuration information tends to be needed to configure the increasing capabilities. Traditionally, memory devices include mode registers in one location of the device, which provides common hardware logic to implement access (read or write) to the mode registers. The hardware logic enables the controlling of timing for reading from and writing to the mode registers, which enables deterministic timing. Some configuration information benefits from being located close to a place it will be used, which results in providing one or more mode registers that are not co-located with the other mode registers, but instead are located near a circuit that will use the configuration information. Examples of memory devices that might be placed in a "critical path" or along a data path in the memory device can be configuration registers for training data generation circuits (e.g., a linear shift feedback register or LSFR) or other circuit, a decision feedback equalization (DFE) configuration register, or other circuit. To provide the same deterministic timing for read and write as other mode registers, a memory designer would need to include additional hardware circuitry to implement the read and write.

Memory subsystems continue to be designed for increasingly higher frequencies for data access, and more specifically, for the transfer of data between the memory device and an associated memory controller. Increasing frequencies make the data transfers more susceptible to noise, and with planned data rates, the data eye may collapse entirely. The data eye refers to the average time between a rising edge of a data signal and a subsequent falling edge. Higher data rates mean the frequency between rising and falling edges increases, and shifting phases due to noise results in enough variation of the timing of rising and falling edges that on the average there is no opening between rising and falling edges.

One approach to recovering the data signal with a collapsed data eye is to implement filtering at the receiver, such as DFE (where DFE can alternatively refer to a decision feedback equalizer that implements the decision feedback equalization). DFE can improve signaling even at higher data rates. However, DFE can require a significant amount of configuration information. Implementing DFE at a memory device receiver can require a significant increase in configuration (e.g., the amount of configuration in a memory device can more than double). Increasing the number of mode registers can significantly increase the design burden on manufacturers to read and write configuration information.

However, the DFE configuration does not typically need to be read with the same timing as other mode registers, since the memory controller will typically only read the DFE configuration as part of a diagnostic routine. Thus, in one embodiment, the DFE mode registers or other mode registers in a memory device can be designed to be written with the same timing as other mode registers, but are read with different timing. In one embodiment, the memory controller does not directly read certain mode registers, but indirectly reads them through a communication register. Such a capability enables directly writing the configuration information to the mode register in accordance with typical mode register write timings, but a read from the register becomes a two-step process to adjust for the different access timings.

While examples are primarily provided with respect to DFE configuration registers, it will be understood that the descriptions apply to any register with different read and write timings. A similar approach could be used for mode registers that have slower write times than read times, or for mode registers that have slower read times than write times. What is described herein can apply to DFE configuration registers, LFSR registers, or other registers. What is described herein can have particular benefit for mode registers that are in a location other than a common location of mode registers within the memory device, such as mode registers spread throughout the memory device.

The memory controller or host performs the slower access (for example, mode register read for DFE configuration) indirectly through a communication register. The communication register is separate from the target mode register. In one embodiment, the communication register is co-located with other mode registers that have similar read and write times. Thus, the communication register can provide expected read timing for the host to read the configuration information. In response to a read request by the host, the target mode register can copy the configuration information to the communication register and allow the host to read the register based on different timing rules than those that apply to the mode register.

FIG. 1 is a block diagram of an embodiment of a memory subsystem in which a mode register can be read through a communication register. System 100 includes a processor and elements of a memory subsystem in a computing device. Processor 110 represents a processing unit of a computing platform that may execute an operating system (OS) and applications, which can collectively be referred to as the host or the user of the memory. The OS and applications execute operations that result in memory accesses. Processor 110 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processor via a bus (e.g., PCI express), or a combination. System 100 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, initial specification published in September 2012 by JEDEC), LPDDR3 (low power DDR version 3, JESD209-3B, August 2013 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), or others or combinations of memory technologies, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one embodiment, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one embodiment, a system with volatile memory that needs to be refreshed can also include nonvolatile memory.

Memory controller 120 represents one or more memory controller circuits or devices for system 100. Memory controller 120 represents control logic that generates memory access commands in response to the execution of operations by processor 110. Memory controller 120 accesses one or more memory devices 140. Memory devices 140 can be DRAM devices in accordance with any referred to above. In one embodiment, memory devices 140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. As used herein, coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one embodiment, settings for each channel are controlled by separate mode registers or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110, such as logic implemented on the same die or implemented in the same package space as the processor.

Memory controller 120 includes I/O interface logic 122 to couple to a memory bus, such as a memory channel as referred to above. I/O interface logic 122 (as well as I/O interface logic 142 of memory device 140) can include pins, pads, connectors, signal lines, traces, or wires, or other hardware to connect the devices, or a combination of these. I/O interface logic 122 can include a hardware interface. As illustrated, I/O interface logic 122 includes at least drivers/transceivers for signal lines. Commonly, wires within an integrated circuit interface couple with a pad, pin, or connector to interface signal lines or traces or other wires between devices. I/O interface logic 122 can include drivers, receivers, transceivers, or termination, or other circuitry or combinations of circuitry to exchange signals on the signal lines between the devices. The exchange of signals includes at least one of transmit or receive. While shown as coupling I/O 122 from memory controller 120 to I/O 142 of memory device 140, it will be understood that in an implementation of system 100 where groups of memory devices 140 are accessed in parallel, multiple memory devices can include I/O interfaces to the same interface of memory controller 120. In an implementation of system 100 including one or more memory modules 170, I/O 142 can include interface hardware of the memory module in addition to interface hardware on the memory device itself. Other memory controllers 120 will include separate interfaces to other memory devices 140.

The bus between memory controller 120 and memory devices 140 can be implemented as multiple signal lines coupling memory controller 120 to memory devices 140. The bus may typically include at least clock (CLK) 132, command/address (CMD) 134, and write data (DQ) and read DQ 136, and zero or more other signal lines 138. In one embodiment, a bus or connection between memory controller 120 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one embodiment, independent channels have different clock signals, C/A buses, data buses, and other signal lines. Thus, system 100 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 120 and memory devices 140. An example of a serial bus technology is 8B10B encoding and transmission of high-speed data with embedded clock over a single differential pair of signals in each direction. In one embodiment, CMD 134 represents signal lines shared in parallel with multiple memory devices. In one embodiment, multiple memory devices share encoding command signal lines of CMD 134, and each has a separate chip select (CS_n) signal line to select individual memory devices.

It will be understood that in the example of system 100, the bus between memory controller 120 and memory devices 140 includes a subsidiary command bus CMD 134 and a subsidiary bus to carry the write and read data, DQ 136. In one embodiment, the data bus can include bidirectional lines for read data and for write/command data. In another embodiment, the subsidiary bus DQ 136 can include unidirectional write signal lines for write and data from the host to memory, and can include unidirectional lines for read data from the memory to the host. In accordance with the chosen memory technology and system design, other signals 138 may accompany a bus or sub bus, such as strobe lines DQS. Based on design of system 100, or implementation if a design supports multiple implementations, the data bus can have more or less bandwidth per memory device 140. For example, the data bus can support memory devices that have either a x32 interface, a x16 interface, a x8 interface, or other interface. The convention "xW," where W is an integer that refers to an interface size or width of the interface of memory device 140, which represents a number of signal lines to exchange data with memory controller 120. The interface size of the memory devices is a controlling factor on how many memory devices can be used concurrently per channel in system 100 or coupled in parallel to the same signal lines. In one embodiment, high bandwidth memory devices, wide interface devices, or stacked memory configurations, or combinations, can enable wider interfaces, such as a x128 interface, a x256 interface, a x512 interface, a x1024 interface, or other data bus interface width.

In one embodiment, memory devices 140 and memory controller 120 exchange data over the data bus in a burst, or a sequence of consecutive data transfers. The burst corresponds to a number of transfer cycles, which is related to a bus frequency. In one embodiment, the transfer cycle can be a whole clock cycle for transfers occurring on a same clock or strobe signal edge (e.g., on the rising edge). In one embodiment, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 140 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 140 represent memory resources for system 100. In one embodiment, each memory device 140 is a separate memory die. In one embodiment, each memory device 140 can interface with multiple (e.g., 2) channels per device or die. Each memory device 140 includes I/O interface logic 142, which has a bandwidth determined by the implementation of the device (e.g., x16 or x8 or some other interface bandwidth). I/O interface logic 142 enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same command and data buses. In another embodiment, multiple memory devices 140 are connected in parallel to the same command bus, and are connected to different data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one embodiment, memory devices 140 are disposed directly on a motherboard or host system platform (e.g., a PCB (printed circuit board) on which processor 110 is disposed) of a computing device. In one embodiment, memory devices 140 can be organized into memory modules 170. In one embodiment, memory modules 170 represent dual inline memory modules (DIMMs). In one embodiment, memory modules 170 represent other organization of multiple memory devices to share at least a portion of access or control circuitry, which can be a separate circuit, a separate device, or a separate board from the host system platform. Memory modules 170 can include multiple memory devices 140, and the memory modules can include support for multiple separate channels to the included memory devices disposed on them. In another embodiment, memory devices 140 may be incorporated into the same package as memory controller 120, such as by techniques such as multi-chip-module (MCM), package-on-package, through-silicon via (TSV), or other techniques or combinations. Similarly, in one embodiment, multiple memory devices 140 may be incorporated into memory modules 170, which themselves may be incorporated into the same package as memory controller 120. It will be appreciated that for these and other embodiments, memory controller 120 may be part of host processor 110.

Memory devices 140 each include memory resources 160. Memory resources 160 represent individual arrays of memory locations or storage locations for data. Typically memory resources 160 are managed as rows of data, accessed via wordline (rows) and bitline (individual bits within a row) control. Memory resources 160 can be organized as separate channels, ranks, and banks of memory. Channels may refer to independent control paths to storage locations within memory devices 140. Ranks may refer to common locations across multiple memory devices (e.g., same row addresses within different devices). Banks may refer to arrays of memory locations within a memory device 140. In one embodiment, banks of memory are divided into sub-banks with at least a portion of shared circuitry (e.g., drivers, signal lines, control logic) for the sub-banks. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one embodiment, memory devices 140 include one or more registers 144. Register 144 represents one or more storage devices or storage locations that provide configuration or settings for the operation of the memory device. In one embodiment, register 144 can provide a storage location for memory device 140 to store data for access by memory controller 120 as part of a control or management operation. In one embodiment, register 144 includes one or more Mode Registers. In one embodiment, register 144 includes one or more multipurpose registers. The configuration of locations within register 144 can configure memory device 140 to operate in different "mode," where command information can trigger different operations within memory device 140 based on the mode. Additionally or in the alternative, different modes can also trigger different operation from address information or other signal lines depending on the mode. Settings of register 144 can indicate configuration for I/O settings (e.g., timing, termination or ODT (on-die termination) 146, driver configuration, or other I/O settings).

In one embodiment, memory device 140 includes ODT 146 as part of the interface hardware associated with I/O 142. ODT 146 can be configured as mentioned above, and provide settings for impedance to be applied to the interface to specified signal lines. In one embodiment, ODT 146 is applied to DQ signal lines. In one embodiment, ODT 146 is applied to command signal lines. In one embodiment, ODT 146 is applied to address signal lines. In one embodiment, ODT 146 can be applied to any combination of the preceding. The ODT settings can be changed based on whether a memory device is a selected target of an access operation or a non-target device. ODT 146 settings can affect the timing and reflections of signaling on the terminated lines. Careful control over ODT 146 can enable higher-speed operation with improved matching of applied impedance and loading.

ODT 146 can be applied to specific signal lines of I/O interface 142, 122, and is not necessarily applied to all signal lines.

Memory device 140 includes controller 150, which represents control logic within the memory device to control internal operations within the memory device. For example, controller 150 decodes commands sent by memory controller 120 and generates internal operations to execute or satisfy the commands. Controller 150 can be referred to as an internal controller, and is separate from memory controller 120 of the host. Controller 150 can determine what mode is selected based on register 144, and configure the internal execution of operations for access to memory resources 160 or other operations based on the selected mode. Controller 150 generates control signals to control the routing of bits within memory device 140 to provide a proper interface for the selected mode and direct a command to the proper memory locations or addresses. Controller 150 includes command logic 152, which can decode command encoding received on command and address signal lines. Thus, command logic 152 can be or include a command decoder. With command logic 152, memory device can identify commands and generate internal operations to execute requested commands.

Referring again to memory controller 120, memory controller 120 includes scheduler 130, which represents logic or circuitry to generate and order transactions to send to memory device 140. From one perspective, the primary function of memory controller 120 could be considered to schedule memory access and other transactions to memory device 140. Such scheduling can include generating the transactions themselves to implement the requests for data by processor 110 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands, or a combination.

Memory controller 120 typically includes logic to allow selection and ordering of transactions to improve performance of system 100. Thus, memory controller 120 can select which of the outstanding transactions should be sent to memory device 140 in which order, which is typically achieved with logic much more complex that a simple first-in first-out algorithm. Memory controller 120 manages the transmission of the transactions to memory device 140, and manages the timing associated with the transaction. In one embodiment, transactions have deterministic timing, which can be managed by memory controller 120 and used in determining how to schedule the transactions.

Referring again to memory controller 120, memory controller 120 includes command (CMD) logic 124, which represents logic or circuitry to generate commands to send to memory devices 140. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 140, memory controller 120 can issue commands via I/O 122 to cause memory device 140 to execute the commands. In one embodiment, controller 150 of memory device 140 receives and decodes command and address information received via I/O 142 from memory controller 120. Based on the received command and address information, controller 150 can control the timing of operations of the logic and circuitry within memory device 140 to execute the commands. Controller 150 is responsible for compliance with standards or specifications within memory device 140, such as timing and signaling requirements. Memory controller 120 can implement compliance with standards or specifications by access scheduling and control.

In one embodiment, memory controller 120 includes refresh (REF) logic 126. Refresh logic 126 can be used for memory resources that are volatile and need to be refreshed to retain a deterministic state. In one embodiment, refresh logic 126 indicates a location for refresh, and a type of refresh to perform. Refresh logic 126 can trigger self-refresh within memory device 140, or execute external refreshes which can be referred to as auto refresh commands) by sending refresh commands, or a combination. In one embodiment, system 100 supports all bank refreshes as well as per bank refreshes. All bank refreshes cause the refreshing of banks within all memory devices 140 coupled in parallel. Per bank refreshes cause the refreshing of a specified bank within a specified memory device 140. In one embodiment, controller 150 within memory device 140 includes refresh logic 154 to apply refresh within memory device 140. In one embodiment, refresh logic 154 generates internal operations to perform refresh in accordance with an external refresh received from memory controller 120. Refresh logic 154 can determine if a refresh is directed to memory device 140, and what memory resources 160 to refresh in response to the command.

In one embodiment, memory device 140 includes register 148, which can be the same as register 144 except that there is a difference between the read and write timing. In one embodiment, register 144 has similar timing for read and write, and can be accessed directly by memory controller 120. In one embodiment, register 148, in contrast, has faster write time than read time. As such, memory controller 120 can directly write register 148, but does not directly read it. Instead of directly reading register 148, in one embodiment, memory device 140 includes communication (comm) register 180 for reads from register 148. In response to a read request that addresses register 148 from memory controller 120, the memory controller does not access the data directly from the data bus (e.g., DQ 136). Rather, register 148 writes data to be read to communication register 180, and memory controller 120 accesses the data from register 180. In one embodiment, memory controller 120 read from communication register 180 via a mode register read operation.

In one embodiment, communication register 180 is located with other mode registers represented by register 144. Communication register 180 can also be referred to as a mailbox or mailbox register. The grouping or co-location of the registers can refer to a physical proximity of the registers to each other, or to the sharing of a read path, or both. In one embodiment, register 144 and register 148 are writeable with mode register write (MRW) operations. In one embodiment, register 144 is readable with a mode register read (MRR) operation, and register 148 is not.

In one embodiment, communication register 180 is writeable with an MRW command and readable with an MRR command. In one embodiment, communication register 180 includes two separate registers or two separate portions, with one portion accessible to memory controller 120 to write address information for register 148 and another portion for register 148 to write contents for memory controller 120 to read. In one embodiment, a single communication register 180 is shared among multiple registers 148, and each can be read in turn.

Figure 2:
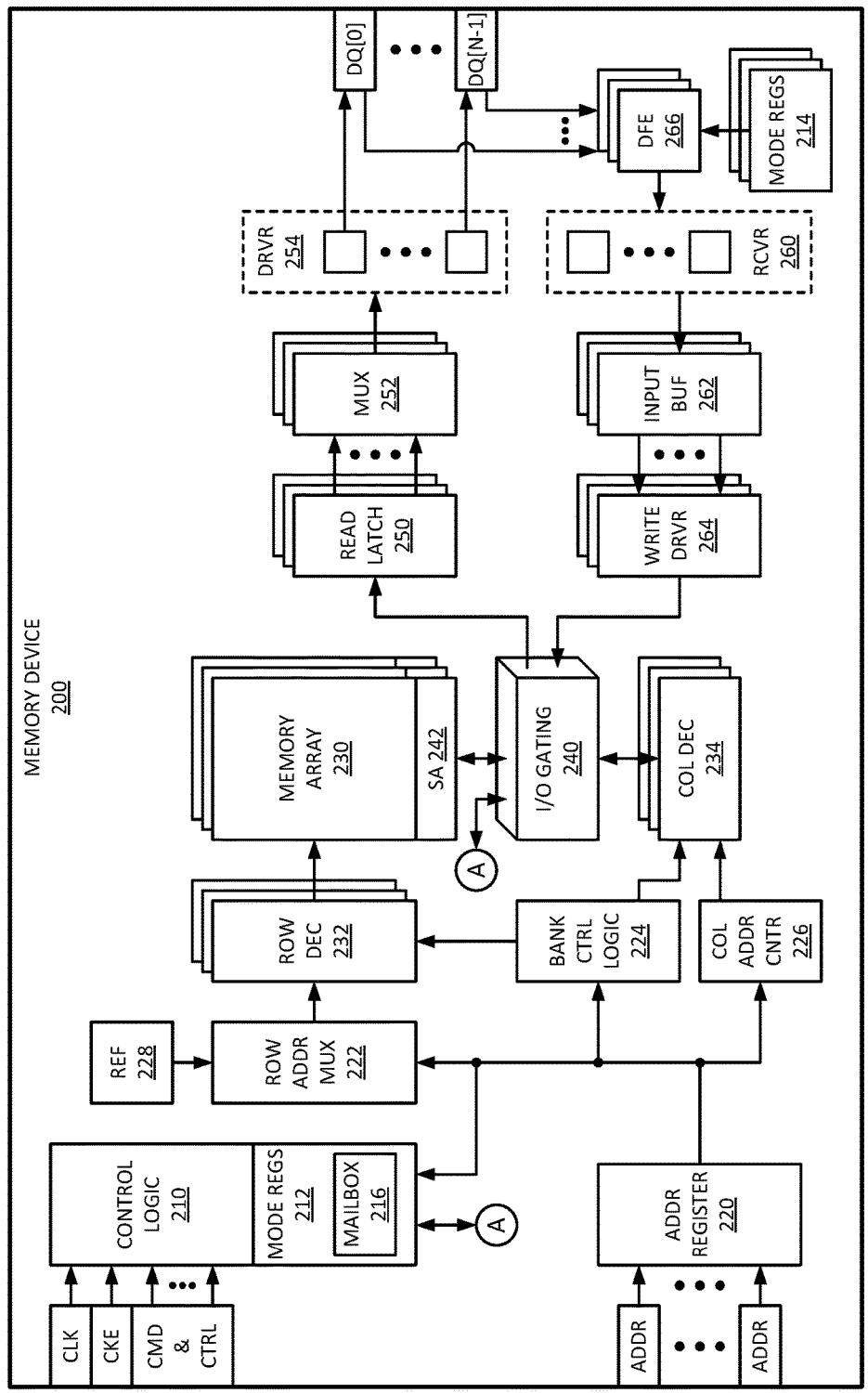
FIG. 2 is a block diagram of an embodiment of a memory device with a communication or mailbox register for a mode register in a critical path.

FIG. 2 is a block diagram of an embodiment of a memory device with a communication or mailbox register for a mode register in a critical path. Memory device 200 represents one example of a memory device in accordance with memory devices 140 of system 100. In one embodiment, memory device 200 is a DRAM device mounted to a substrate to connect to a CPU as in-package memory.

Address (addr) register 220 receives address information (ADDR) such as row address and bank address signals to identify the portion of memory that is to be affected by a particular command. The address, clock (CLK), clock enable (CKE), and command (CMD) and control (CTRL) signals represent I/O connectors for command and address for memory device 200. Control logic 210 receives CLK, CKE, and CMD, and controls the operation of memory device 200 in relation to those signals. In one embodiment, address register 220 distributes the address information to row address multiplexer (row addr mux) 222, bank control (ctrl) logic 224, and column address counter (col addr cntr) 226. Row address mux 222 takes the row address information and a refresh counter (ref 228) as input, and controls the row address latch (RAL) and decoder (row decoder 232) for each bank of the memory device. Bank control logic 224 selects which bank will be selected for the memory access operation (e.g., based on the command) received. Column address counter 226 generates a signal to select the column for the operation.

Row decoder (dec) 232 selects an address in a bank, which can include a row of memory array 230. In one embodiment, memory arrays 230 can be or include subarrays. Signals from bank control logic 224 and column address counter 226 can trigger column decoder (col dec) 234 to activate the appropriate sense amplifiers (SA) 242 for the desired memory array 230. Column decoder (col dec) 234 can trigger I/O gating 240, which represent the hardware including signal lines or wires as well as logic to route data to and from memory arrays 230. I/O gating 240 can place data into sense amplifiers 242 for a write operation, and can read the data out for a read operation. Column decoder 234 makes a column selection for I/O gating 240 based on bank control logic selection and the column address counter selection and.

In one embodiment, read latch 250 is coupled to receive data bits from I/O gating 240 for a read operation. Read latch 250 feeds the data into mux 252, which can select the number of bits corresponding to the device data interface. Mux 252 can send the data to driver (drvr) 254, which will drive the data on I/O connectors DQ[0:(N−1)]. While not specifically illustrated, it will be understood that driver 254 can drive on or more data strobe lines based on the timing. For a write operation, the controller will provide data on DQ[0:(N−1)]. In one embodiment, receiver (rcvr) 260 receives write data from the data bus, and inputs it into input register or input buffer 262. In one embodiment, receiver 260 receives a data mask signal (DM) that can indicate when the memory device should perform a read operation. Input buffer (buf) 262 samples the data in accordance with a data strobe line, and can latch the data to write driver (drvr) 264, which provides the data to I/O gating 240.

Memory device 200 includes mode registers (regs) 212, which represent standard mode registers of the memory device or mode registers that store configuration information to control various runtime operational modes for memory device 200. Mode register 212 have associated read and write timings that are compatible with standard mode register commands. Control logic 210 can operate based on settings stored in mode registers 212.

In one embodiment, memory device 200 includes DFE 266 to provide filtering for receive data. The filtering can operate to "open" the data eye for data signals received by receiver 260. DFE 266 operates based on configuration information stored in mode registers 214, which represent mode registers that are not located with the standard mode registers, and which have different read and write timings. In one embodiment, an associated memory controller can directly write mode registers 214, and instead of directly reading the mode registers, memory device 200 writes the data of mode registers 214 to mailbox 216, which can be referred to as a communication register. Mailbox 216 can operate in accordance with any embodiment of a communication register described herein.

It is anticipated that DDR5 will add DFE to a DRAM device to improve I/O swing. However, due to process characteristics of DRAM designs, DDR5 DRAMs may not implement fully automatic DFE that is able to configure itself. Consequently, the configuration would come from outside the DFE circuits, which can result in a need for over 140 bytes of mode registers being defined per bit of DFE. Thus, in one embodiment, mode registers 214 can represent a number of mode registers to store over 140 bytes of data times the number of DFE bits to implement. It will be understood that the amount of data is an example only, and more data or less data can be used. Additionally or alternatively, other data can be stored for purposes other than DFE. DFE 266 represents the DFE circuits to apply to receiver 260. It will be understood that there can be a DFE circuit for each of the N data signal lines DQ.

Normally mode registers are located in a non-critical area of the memory device die; however, in one embodiment, DFE mode registers 214 need to be co-located with the DFE circuits represented by DFE 266. Mode registers 214 can be considered to be in a critical path because of being located near the device input/output. In one embodiment, mode registers 214 are write only with respect to an associated memory controller (not shown). Thus, the memory controller can write mode registers 214 directly with a mode register operation, but has no read access directly to the mode registers. To read mode registers 214, in one embodiment, in response to a read request that includes an address of any of mode registers 214, the addressed mode register writes its content to mailbox register 216, which can be a communication register. Mailbox register 216 can include multiple addressable portions, or portions accessible via different addresses.

In one embodiment, mailbox register 216 includes at least portions, one to receive address information from the memory controller, and one to provide data for access by the memory controller. In such an embodiment, the address portion can be a write-only register with respect to the memory controller, which writes the address information for use by memory device 200 to address a location of mode registers 214. The data contents portion can be a read-only register with respect to the memory controller, which cannot write the register, but accesses the mailbox register to read contents written to it from mode registers 214.

In one embodiment, mailbox register 216 shares timing parameters with mode registers 212. Thus, for example, read and write timing to mailbox register 216 is the same as mode registers 212. In one embodiment, the data to be read from mailbox register 216 is for purposes of debug or error management within memory device 200, and the extra time needed to write address information to mailbox register 216 and then wait for contents to be transferred from a mode register 214 to mailbox register 216 does not negatively affect runtime operation of memory device 200. While read and write timing of mailbox register 216 may be of expected timing, the timing between reading the contents after writing the address information may include a delay.

Figure 3:
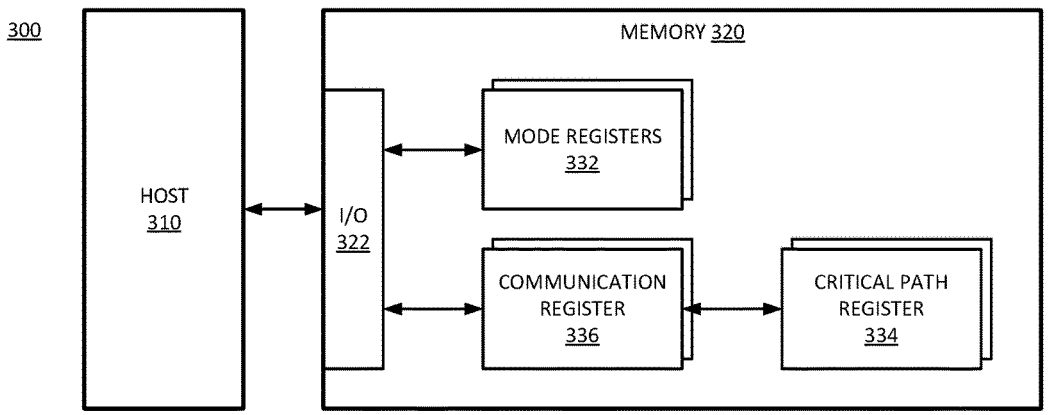
FIG. 3 is a block diagram of an embodiment of a memory system with a communication register for reading a critical path register.

FIG. 3 is a block diagram of an embodiment of a memory system with a communication register for reading a critical path register. System 300 provides one example of a memory subsystem in accordance with system 100 of FIG. 1. Memory 320 can be one example of a memory device in accordance with memory device 140 of FIG. 1 or memory device 200 of FIG. 2.

Host 310 represents circuitry or logic that manages access to memory 320. In one embodiment, host 310 is or includes a memory controller. The memory controller can include a standalone component or a circuit integrated with a processor, or a combination. In one embodiment, the memory controller is an interface circuit on a processor die. Memory 320 includes I/O 322, which represents components to enable memory 320 to interface to signal lines coupled to host 310. Host 310 similarly includes I/O components that are not specifically shown in system 300. I/O 322 can include drivers, receivers, electrical connections to signal lines, and other hardware. In one embodiment, I/O 322 includes DFE components that operate based on data stored in one or more critical path mode registers 334.

Memory 320 includes mode registers 332, which represent storage locations for configuration information to control the functions of memory 320. Critical path register 334 also stores configuration information, but is either not directly readable or directly writeable by host 310. Communication register 336 provides a communication mechanism for indirect access by host 310. For indirect read, such as accessing DFE configuration information, I/O 322 receives a read request from host 310 and critical path register 334 writes contents to communication register 336 for access by host 310. Host 310 accesses the contents from communication register 336. For indirect write, I/O 322 receives a write request and stores the contents to be written into communication register 336. Memory 320 transfers the contents from communication register 336 to critical path register 334 to write the critical path register. In either the indirect read or indirect write, the transfer of contents between communication register 336 and critical path register 334 occurs outside the read and write operations of mode register read or write by host 310. The transfer of contents involves internal operations of memory 320.

A read from communication register 336 will have some timing exception to allow the transfer of contents from critical path register 334 to communication register 336. The same would be true for a write for indirect write. In one embodiment, host 310 will not read communication register 336 until receiving an indication that the information in communication register 336 is ready to read. In one embodiment, host 310 receives indication via a polling routine where host 310 generates a query. In one embodiment, in response to transferring contents to communication register 336, memory 320 sets a bit in one of mode register 332 that host 310 can read to determine when the communication register is ready to be read. In one embodiment, memory 320 can provide an indication signal, such as by generating a signal on a signal line of I/O 322 (such as an alert or other signal line).

In one embodiment, host 310 includes configuration information or preprogrammed information to indicate a timing of transferring the contents from critical path register 334 to communication register 336. Based on such configuration information, host 310 can generate a read address to communication register 336, and read the contents of critical path register 334 from communication register 336 based on a configured delay. An approach based on the timing of transferring contents from critical path register 334 to communication register 336 may result in different timings based on different types of memory devices, which would complicate the implementation of the indirect read.

Thus, in one embodiment, host 310 polls memory 320 to determine if communication register 336 has been populated with the contents of an addressed critical path register 334. In one embodiment, host 310 can know that communication register 336 will be populated with a given amount of time. In one embodiment, communication register 336 includes one address portion and one contents portions. The address portion enables host 310 to identify one of multiple critical path registers 334 that share the communication register. The addressed critical path register 334 will transfer its configuration information to a shared data portion or contents portion, which host 310 can access.

Figure 4A:
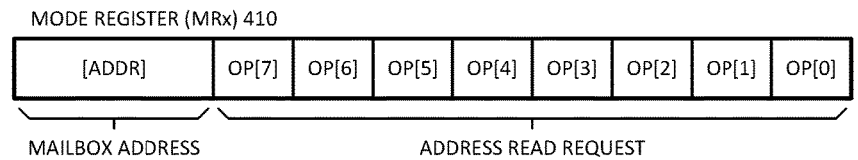
FIGS. 4A-4B are diagrammatic representations of communication registers.
Figure 4B:
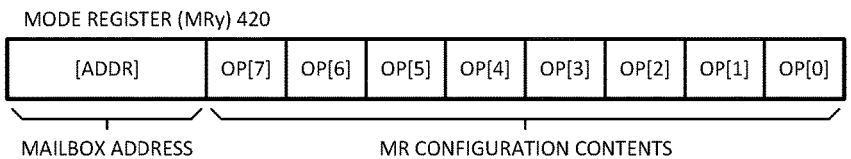

FIGS. 4A-4B are diagrammatic representations of communication registers. Referring to FIG. 4A, mode register 410 represents an address portion of a communication register, in accordance with an embodiment of a communication register that has separate address and content portions. Referring to FIG. 4B, mode register 420 represents a data contents portion of a communication register, in accordance with an embodiment of a communication register that has separate address and content portions. In one embodiment, the portions overlap. In one embodiment, the address and contents portions are separate fields of the same register.

In one embodiment, mode register 410 is included in a mode register identified as MRx, and includes an address portion [ADDR]. The address read request is illustrated as including 8 bits identified by OP[7:0]. Similarly, in one embodiment, mode register 420 is included in a mode register identified as MRy, and includes an address portion [ADDR] to address or access the mode register. In one embodiment, MRx and MRy are the same mode register. In one embodiment, MRx and MRy are the same mode register with different addresses. The MR configuration contents are illustrated as including 8 bits of data identified by OP[7:0].

In one embodiment, mode register 410 is an address read request mode register, and is write-only with respect to the host. In one embodiment, the host can only write the register but not read it. The register is read internally by the memory device to identify a mode register whose contents are to be transferred to the configuration contents of mode register 420. In one embodiment, mode register 420 stores configuration contents for access by the host and is a read only register with respect to the host. In one embodiment, the host reads the contents from mode register 420, but is not permitted to write to the register. Through mode register 410, the host can identify a mode register to read by writing the address to the register. Through mode register 420, the host can read the contents of the identified mode register that are transferred from a target mode register.

Consider an example where mode registers 410 and 420 provide for reading contents of DFE mode registers. In one embodiment, mode register 410 is a DFE address read request register where the host provides a DRAM with that DFE mode register address that is being requested. In one embodiment, mode register 420 is a DFE configuration content register which the memory device populates with the configuration information of a target mode register for access by the host. In one embodiment, the access to the data by the host would be in the same format that normal mode registers provide. With a read involving writing the address to mode register 410 and then reading from mode register 420, it will be understood that such a read will have a delay that is more than a standard read of a mode register. In one embodiment, the delay between writing mode register 410 and outputting the contents into mode register 420 is defined by a timing parameter, such as tMRR_dfe. Such a timing parameter would be different from a tMRR for a normal mode register read. In one embodiment, the memory device keeps the contents of mode register 420 until another DFE address read request is sent and tMRR_dfe is met. In one embodiment, an indirect read is performed only for configuration information accessed by the host for debug or other non-runtime operation. If the read relates to an operation that is not a normal runtime operation, the delay time can be flexible.

Figure 5:
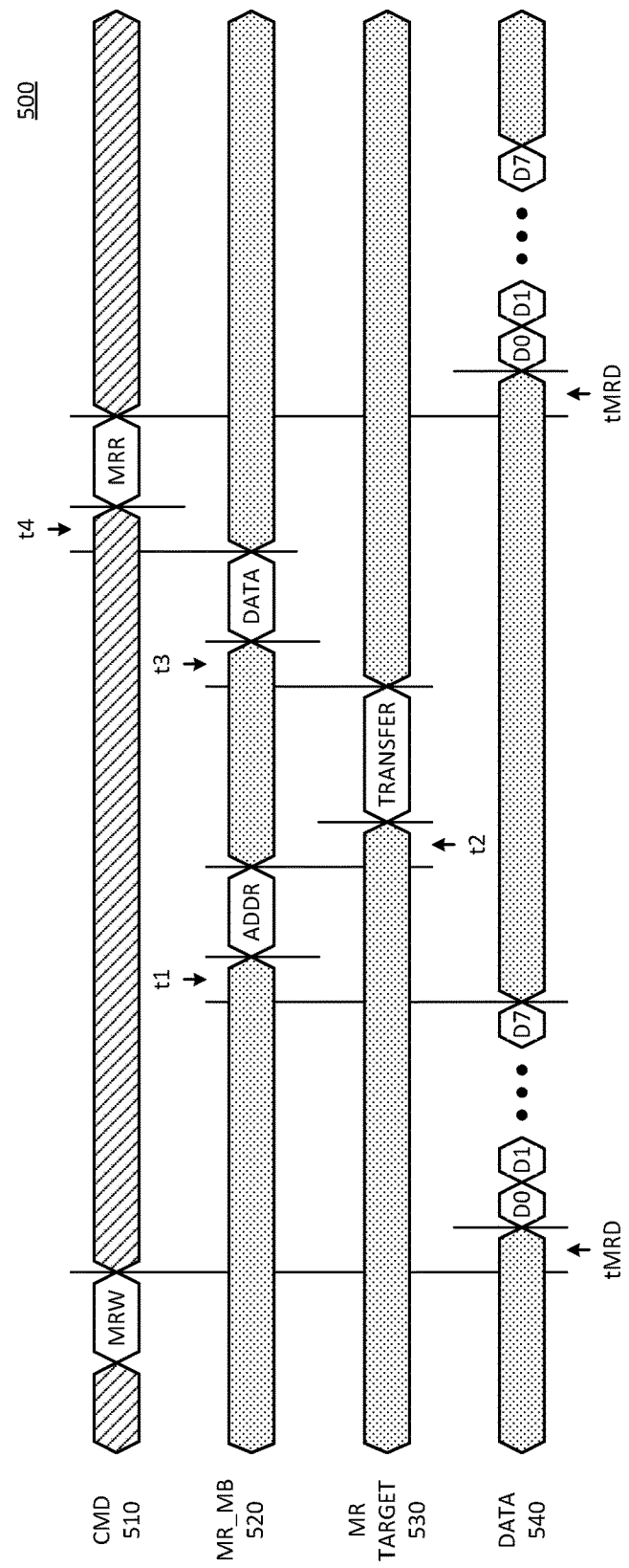
FIG. 5 is a timing diagram of an embodiment of reading a mode register indirectly via a communication register.

FIG. 5 is a timing diagram of an embodiment of reading a mode register indirectly via a communication register. Diagram 500 illustrates an embodiment of timing for a communication register such as register 180 of system 100 or register 216 of system 200. Diagram 500 illustrates various relative events for command (cmd) signal line 510, mailbox mode register (MR_MB) 520, the target mode register (MR target) 530 or mode register to be read, and the data bus 540.

In one embodiment, a memory controller sends a mode register write command, MRW as shown on command line 510, to write an address of a target mode register to a communication register. After a delay tMRD, data bus 540 shows data D[7:0] as the data address to accompany the communication mode register address that will be in the MRW command. The delay tMRD refers to a mode register set command cycle time, and the delay after the write command can be considered a tMRW delay.

After a delay of t1, the address information ADDR is ready in the mailbox mode register. In response to the writing of the address information, the memory device causes the target mode register to transfer its contents to the mailbox mode register. After a delay period t2, target mode register 530 is illustrated performing a transfer of data, which is ready in mailbox mode register 520 after a delay period t3. After either a configured period of time represented by delay period t4, or after a delay t4 when the memory controller polls the mailbox, the memory controller sends a mode register read command, MRR, to read the data in mailbox register 520. Thus, in one embodiment, delay t4 can include receipt of a polling request by the host to determine if mailbox register 520 is ready to read. The MRR command includes the address of mailbox register 520 where the data contents are held. After a delay period tMRD, the mailbox mode register sends the data over data bus 540, as shown by data D[7:0]. The delay tMRD here can be considered a tMRR delay.

As an alternative to the indirect read illustrated, in one embodiment, the host can perform an MRR directly to a mode register with offset timing (such as a DFE register). Instead of content being ready from the mode register in tMRD, the memory controller subsequently issues another MRR command to the mailbox register. Thus, in the example of diagram 500, the MRW command could be an MRR command addressed to target mode register 530. The second MRR command could be addressed to mailbox mode register 520 to read the contents stored there in response to the first MRR command. It will be understood that such a process may require defining an exception clause for every mode register address that cannot be read in tMRD. Such exceptions would complicate scheduling at the memory controller, and may require different definitions based on the specific memory device.

Figure 6:
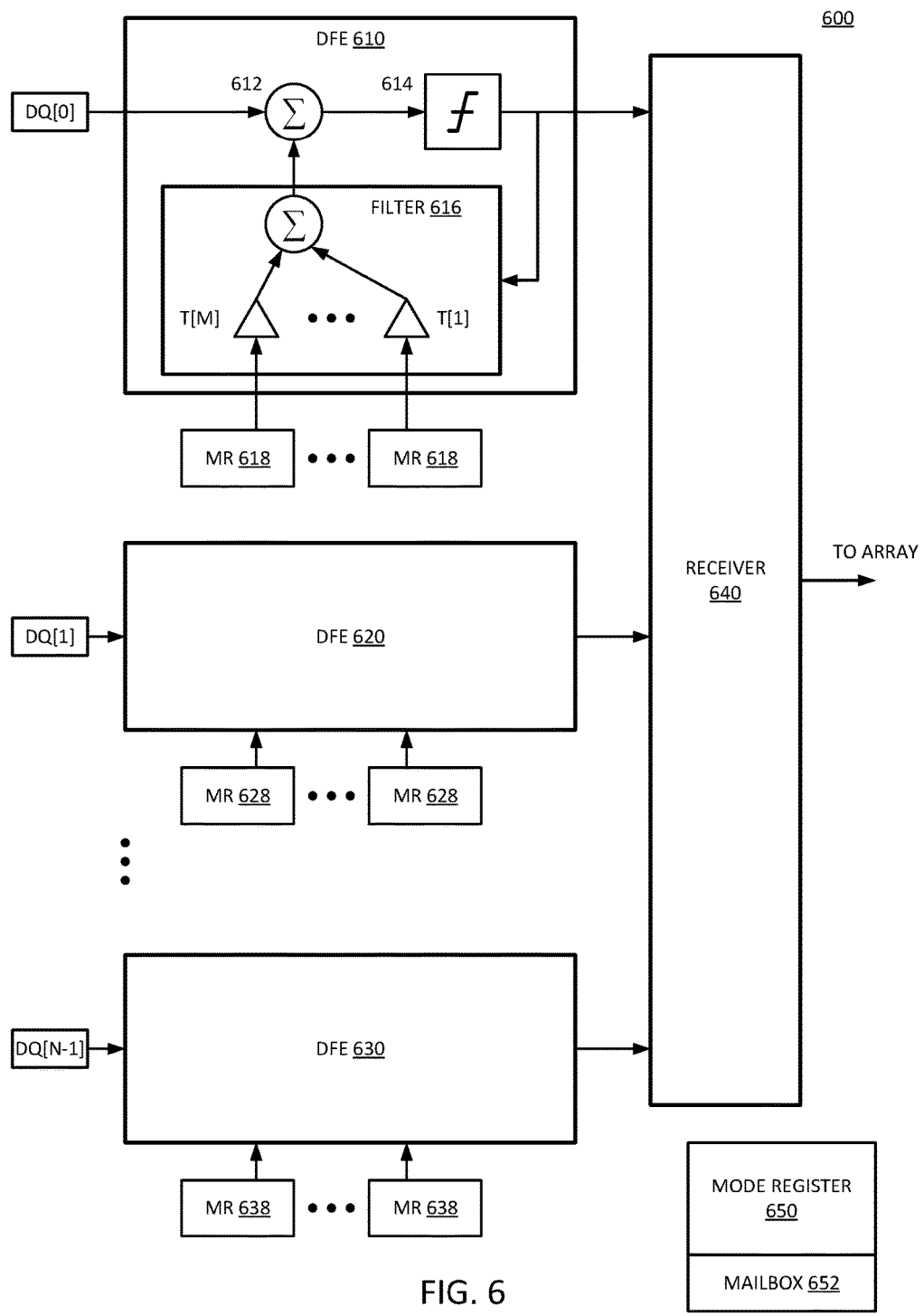
FIG. 6 is a block diagram of an embodiment of a memory device with decision feedback equalization configured by mode registers that are read via a communication register.

FIG. 6 is a block diagram of an embodiment of a memory device with decision feedback equalization configured by mode registers that are read via a communication register. System 600 can be one example of a memory device in accordance with any embodiment described herein, such as memory device 140 of FIG. 1 or memory device 200 of FIG. 2. System 600 illustrates components of receive I/O for the memory device. More specifically, system 600 illustrates N data signal line interfaces, DQ[N−1:0]. In one embodiment, system 600 includes DFE between the data signal line interface and receiver logic 640. In one embodiment, each signal line has separate DFE circuitry, as illustrated by DFE 610 on the input path of DQ[0], DFE 620 on the input path of DQ[1], and DFE 630 on the input path of DQ[N−1]. Only the details of DFE 610 are illustrated, but the other DFE components can be similar or the same.

The DFE circuits provide filtered data to receiver logic 640 for further processing by the memory, and to perform operations on the memory array based on the received commands. The memory device of system 600 can include mode registers (MR) 650. In one embodiment, mode registers 650 include mailbox register 652. In one embodiment, mailbox register 652 is separate from mode registers 650 but subject to the same timing rules and can be located proximate to the other mode registers.

In one embodiment, DFE 610 includes summation circuit 612 at its front end, decision slicer circuit 614 at its back end, and feedback filter path 616. Filter 616 can be referred to as a feedback path or a tapped feedback path that includes multiple taps for multiple previously sampled digital bit values. DFE 610 can remove inter symbol interference (ISI) to reduce distortion for a high speed digital signal stream received DQ[0].

Very high speed digital pulses tend to lose their sharp rectangular shape as they propagate along a signal trace, resulting in more drawn out, wider, rounder shapes by the time they are received at the receiving end. The wider rounded pulses can extend into the time slot of neighboring pulses. The pulse shape of any pulse can therefore become even more corrupted by the interfering waveforms of its neighboring pulses in the digital stream.

In one embodiment, filter 616 includes M "taps" T[M:1] in a feedback loop, where the different taps can be specifically tuned to remove interference from a preceding pulse or a pulse that was received ahead of the current pulse whose digital value is being determined. Decision slicer 614 determines the digital value (1 or 0) of the digital pulse that is currently being received. The M taps have associated coefficients Wn to configure the tap for removing interference from a preceding digital pulse. In one embodiment, the coefficients are determined for each tap and stored in corresponding mode registers 618.

The coefficients can capture the amplitude (or amount) of a prior pulse that interferes with the current pulse, and summation circuit 612 subtracts the particular amplitude from the currently received signal. The subtraction ideally completely removes any or all interference from the prior pulses. In one embodiment, the taps are designed for specific previously received signals. For example, tap T[1] can be configured to remove interference from an immediately preceding received signal, T[2] from the received signal prior to that, and so forth. The DFE can be configured to remove interference from as many preceding signals as determined for a system, with one tap per preceding signal. In one embodiment, DFE 610 includes two taps. In one embodiment, DFE 610 includes four taps. Other numbers of taps are possible.

It will be understood that with different signal paths for the different data bits, the DFE coefficients can be different for each tap, and for each DFE circuit. Thus, the group of mode register 618 stores configuration information for DFE 610, and more specifically for the different taps of filter 616. Similarly, mode registers 628 provide configuration for taps of a filter path for DFE 620. Similarly, mode registers 638 provide configuration for taps of a filter path for DFE 630. In one embodiment, system 600 determines the values of the various coefficients based during training, such as in conjunction with boot up. In one embodiment, the host associated with system 600 (not specifically shown) can determine the coefficients and write them to the various mode registers. In one embodiment, the host only accesses or reads the mode registers as part of a debugging mechanism.

System 600 can be applied to upcoming memory devices. For example, DDR5 DRAM devices are expected to have DFE circuitry to deal with the closing data eyes based on increased data rates. DDR4 had a total of 40 mode registers for the configuration information for the various modes present in the memory devices. DFE is anticipated to include 128 bytes of data. The DFE could require 136 registers only for the DFE configuration. Thus, the techniques for writing and reading mode register configuration that have existed in previous DRAM versions may not be sufficient for future generations of devices. Not only will DFE cause a significant increase in the number of mode registers needing configuration, but the DFE mode registers are physically in a different location from the standard mode registers (they are in the I/O path).

In one embodiment, the nature of mode registers 618, 628, and 638 are changed relative to mode registers 650. Namely, for DFE, mode registers 618, 628, and 638 can include a fast write path. In one embodiment, the write paths allow for streaming the write of the configuration data. In one embodiment, the read path to these same registers is slow, and occurs through mailbox register 652. By causing all slow mode register read traffic to occur through the mailbox register, the system configuration can have timing and access exceptions only for mailbox register 652, and all the mode registers with slow read paths can have their slow read hidden behind mailbox register 652. Thus, rather than having a large number of registers with different timing parameters, system 600 can have one exception type.

Figure 7:
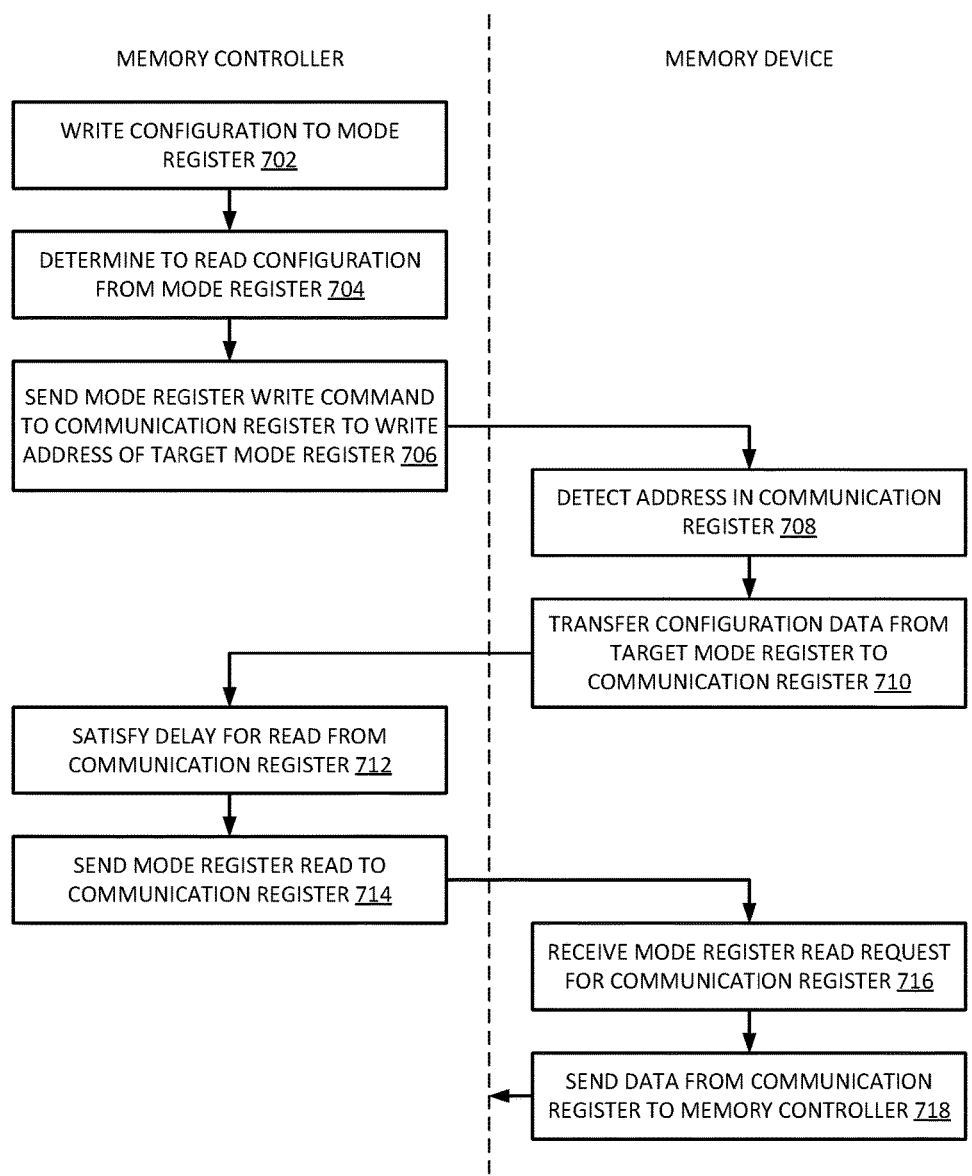
FIG. 7 is a flow diagram of an embodiment of reading a mode register indirectly via a communication register.

FIG. 7 is a flow diagram of an embodiment of reading a mode register indirectly via a communication register. The process can be executed between a memory controller or comparable component and a memory device that has mode registers with timing differences between the read and write paths.

In one embodiment, the memory controller writes configuration information to a mode register that has offset read and write timing, 702. At some later time, the memory controller can determine to read the configuration from the mode register, 704. For example, the memory controller can determine to read the configuration information as part of a debug process.

In one embodiment, to read the mode registers, the memory controller sends a mode register write command to a communication register to write an address of the target mode register to be read, 706. In response to the writing of the address, the memory device detects the address in the communication register, 708. In response to receiving the address, the memory device can copy or transfer the configuration data from the target mode register to the communication register, 710.

The memory controller can read the communication register after satisfying a delay period, 712. In one embodiment, satisfying the delay includes waiting a predefined period of time. In one embodiment, satisfying the delay includes polling the memory device to determine if the communication register is ready to read. In one embodiment, the memory device triggers a ready signal to indicate when the communication register is populated with configuration data for a read. After the delay, in one embodiment, the memory controller sends a mode register read to the communication register, 714. The memory device receives the mode register read command for the communication register, 716, and sends the data from the communication register to the memory controller, 718. In one embodiment, the communication register is shared among multiple registers, and the memory controller can read the configuration data of the multiple mode registers via the communication register by repeating the sending of address information and read requests to obtain the configuration data. Thus, each mode register could be read in turn.

Figure 8:
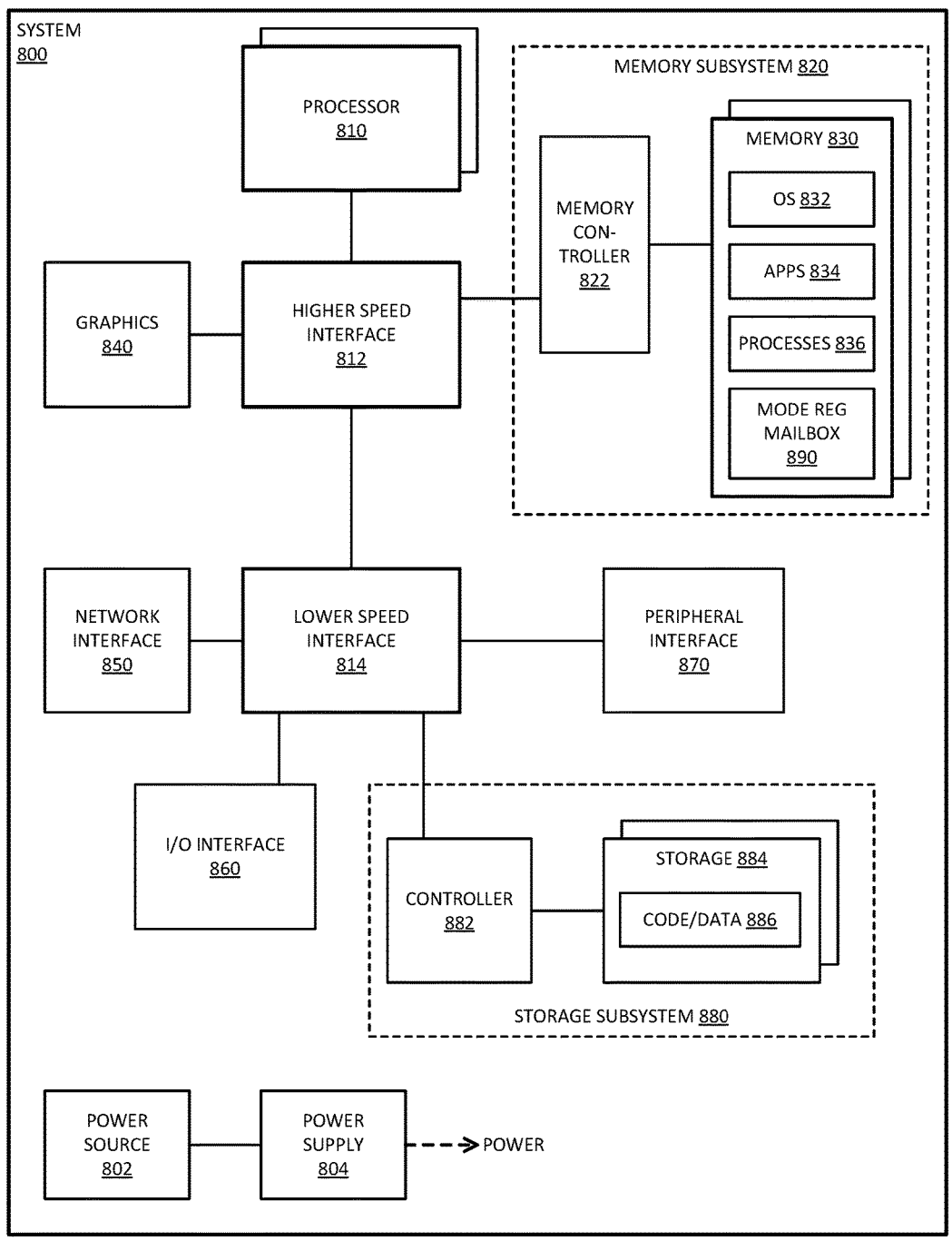
FIG. 8 is a block diagram of an embodiment of a computing system in which a memory system with a communication register to read a mode register can be implemented.

FIG. 8 is a block diagram of an embodiment of a computing system in which a memory system with a communication register to read a mode register can be implemented. System 800 represents a computing device in accordance with any embodiment described herein, and can be a laptop computer, a desktop computer, a tablet computer, a server, a gaming or entertainment control system, a scanner, copier, printer, routing or switching device, embedded computing device, a smartphone, a wearable device, an internet-of-things device or other electronic device.

System 800 includes processor 810, which provides processing, operation management, and execution of instructions for system 800. Processor 810 can include any type of microprocessor, central processing unit (CPU), graphics processing unit (GPU), processing core, or other processing hardware to provide processing for system 800, or a combination of processors. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 800 includes interface 812 coupled to processor 810, which can represent a higher speed interface or a high throughput interface for system components that needs higher bandwidth connections, such as memory subsystem 820 or graphics interface components 840. Interface 812 represents an interface circuit which can be a standalone component or integrated onto a processor die. Where present, graphics interface 840 interfaces to graphics components for providing a visual display to a user of system 800. In one embodiment, graphics interface 840 can drive a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, the display can include a touchscreen display. In one embodiment, graphics interface 840 generates a display based on data stored in memory 830 or based on operations executed by processor 810 or both. In one embodiment, graphics interface 840 generates a display based on data stored in memory 830 or based on operations executed by processor 810 or both.

Memory subsystem 820 represents the main memory of system 800, and provides storage for code to be executed by processor 810, or data values to be used in executing a routine. Memory subsystem 820 can include one or more memory devices 830 such as read-only memory (ROM), flash memory, one or more varieties of random access memory (RAM) such as DRAM, or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software logic to provide functions for system 800. In one embodiment, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one embodiment, system 800 includes interface 814, which can be coupled to interface 812. Interface 814 can be a lower speed interface than interface 812. In one embodiment, interface 814 represents an interface circuit, which can include standalone components and integrated circuitry. In one embodiment, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary interfaces. Network interface 850 can exchange data with a remote device, which can include sending data stored in memory or receiving data to be stored in memory.

In one embodiment, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one embodiment, system 800 includes storage subsystem 880 to store data in a nonvolatile manner. In one embodiment, in certain system implementations, at least certain components of storage 880 can overlap with components of memory subsystem 820. Storage subsystem 880 includes storage device(s) 884, which can be or include any conventional medium for storing large amounts of data in a nonvolatile manner, such as one or more magnetic, solid state, or optical based disks, or a combination. Storage 884 holds code or instructions and data 886 in a persistent state (i.e., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (i.e., the value or state of the data is indeterminate if power is interrupted to system 800). In one embodiment, storage subsystem 880 includes controller 882 to interface with storage 884. In one embodiment controller 882 is a physical part of interface 814 or processor 810, or can include circuits or logic in both processor 810 and interface 814.

Power source 802 provides power to the components of system 800. More specifically, power source 802 typically interfaces to one or multiple power supplies 804 in system 802 to provide power to the components of system 800. In one embodiment, power supply 804 includes an AC to DC (alternating current to direct current) adapter to plug into a wall outlet. Such AC power can be renewable energy (e.g., solar power) power source 802. In one embodiment, power source 802 includes a DC power source, such as an external AC to DC converter. In one embodiment, power source 802 or power supply 804 includes wireless charging hardware to charge via proximity to a charging field. In one embodiment, power source 802 can include an internal battery or fuel cell source.

Memory device 830 can be a memory device in accordance with any embodiment described herein. Memory device 830 includes mode registers (not specifically shown) that store configuration information for the memory device. In one embodiment, one or more of the mode registers has one type of access (read or write) that is faster than the other, where memory controller 822 can directly access for the one type of access, and for the other type it accesses via mode register mailbox 890. Mode register mailbox 890 represents a communication register in accordance with any embodiment disclosed herein. For example, for a read that is slower than a write, memory controller 822 can directly write a mode register and reads the mode register via mailbox register 890, in accordance with an embodiment described herein.

Figure 9:
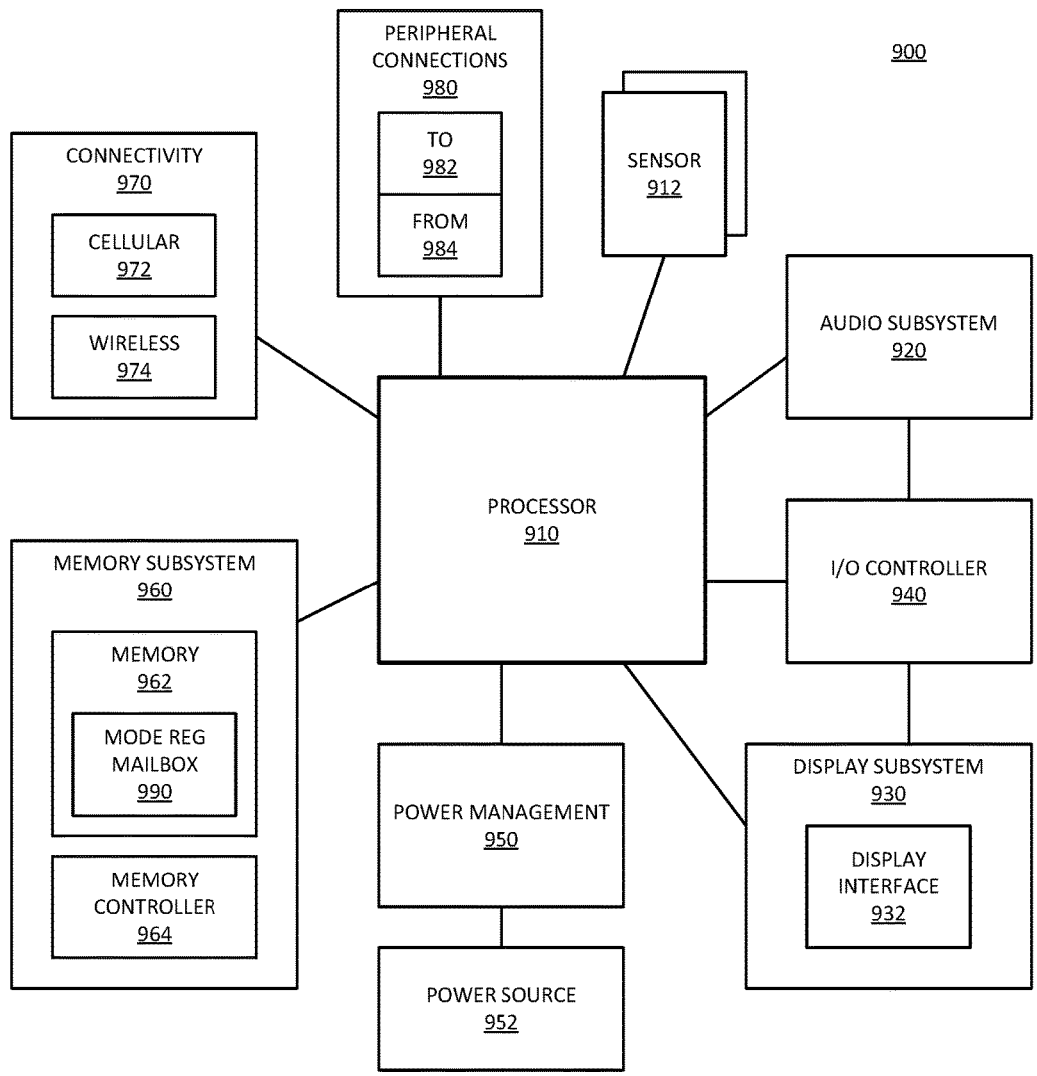
FIG. 9 is a block diagram of an embodiment of a mobile device in which a memory system with a communication register to read a mode register can be implemented.

FIG. 9 is a block diagram of an embodiment of a mobile device in which a memory system with a communication register to read a mode register can be implemented. Device 900 represents a mobile computing device, such as a computing tablet, a mobile phone or smartphone, a wireless-enabled e-reader, wearable computing device, an internet-of-things device or other mobile device, or an embedded computing device. It will be understood that certain of the components are shown generally, and not all components of such a device are shown in device 900.

Device 900 includes processor 910, which performs the primary processing operations of device 900. Processor 910 can include one or more physical devices, such as microprocessors, application processors, microcontrollers, programmable logic devices, or other processing means. The processing operations performed by processor 910 include the execution of an operating platform or operating system on which applications and device functions are executed. The processing operations include operations related to I/O (input/output) with a human user or with other devices, operations related to power management, operations related to connecting device 900 to another device, or a combination. The processing operations can also include operations related to audio I/O, display I/O, or other interfacing, or a combination. Processor 910 can execute data stored in memory. Processor 910 can write or edit data stored in memory.

In one embodiment, system 900 includes one or more sensors 912. Sensors 912 represent embedded sensors or interfaces to external sensors, or a combination. Sensors 912 enable system 900 to monitor or detect one or more conditions of an environment or a device in which system 900 is implemented. Sensors 912 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 912 can also include sensors for biometric systems such as fingerprint recognition systems, face detection or recognition systems, or other systems that detect or recognize user features. Sensors 912 should be understood broadly, and not limiting on the many different types of sensors that could be implemented with system 900. In one embodiment, one or more sensors 912 couples to processor 910 via a frontend circuit integrated with processor 910. In one embodiment, one or more sensors 912 couples to processor 910 via another component of system 900.

In one embodiment, device 900 includes audio subsystem 920, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 900, or connected to device 900. In one embodiment, a user interacts with device 900 by providing audio commands that are received and processed by processor 910.

Display subsystem 930 represents hardware (e.g., display devices) and software components (e.g., drivers) that provide a visual display for presentation to a user. In one embodiment, the display includes tactile components or touchscreen elements for a user to interact with the computing device. Display subsystem 930 includes display interface 932, which includes the particular screen or hardware device used to provide a display to a user. In one embodiment, display interface 932 includes logic separate from processor 910 (such as a graphics processor) to perform at least some processing related to the display. In one embodiment, display subsystem 930 includes a touchscreen device that provides both output and input to a user. In one embodiment, display subsystem 930 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, display subsystem includes a touchscreen display. In one embodiment, display subsystem 930 generates display information based on data stored in memory or based on operations executed by processor 910 or both.

I/O controller 940 represents hardware devices and software components related to interaction with a user. I/O controller 940 can operate to manage hardware that is part of audio subsystem 920, or display subsystem 930, or both. Additionally, I/O controller 940 illustrates a connection point for additional devices that connect to device 900 through which a user might interact with the system. For example, devices that can be attached to device 900 might include microphone devices, speaker or stereo systems, video systems or other display device, keyboard or keypad devices, or other I/O devices for use with specific applications such as card readers or other devices.

As mentioned above, I/O controller 940 can interact with audio subsystem 920 or display subsystem 930 or both. For example, input through a microphone or other audio device can provide input or commands for one or more applications or functions of device 900. Additionally, audio output can be provided instead of or in addition to display output. In another example, if display subsystem includes a touchscreen, the display device also acts as an input device, which can be at least partially managed by I/O controller 940. There can also be additional buttons or switches on device 900 to provide I/O functions managed by I/O controller 940.

In one embodiment, I/O controller 940 manages devices such as accelerometers, cameras, light sensors or other environmental sensors, gyroscopes, global positioning system (GPS), or other hardware that can be included in device 900, or sensors 912. The input can be part of direct user interaction, as well as providing environmental input to the system to influence its operations (such as filtering for noise, adjusting displays for brightness detection, applying a flash for a camera, or other features).

In one embodiment, device 900 includes power management 950 that manages battery power usage, charging of the battery, and features related to power saving operation. Power management 950 manages power from power source 952, which provides power to the components of system 900. In one embodiment, power source 952 includes an AC to DC (alternating current to direct current) adapter to plug into a wall outlet. Such AC power can be renewable energy (e.g., solar power, motion based power). In one embodiment, power source 952 includes only DC power, which can be provided by a DC power source, such as an external AC to DC converter. In one embodiment, power source 952 includes wireless charging hardware to charge via proximity to a charging field. In one embodiment, power source 952 can include an internal battery or fuel cell source.

Memory subsystem 960 includes memory device(s) 962 for storing information in device 900. Memory subsystem 960 can include nonvolatile (state does not change if power to the memory device is interrupted) or volatile (state is indeterminate if power to the memory device is interrupted) memory devices, or a combination. Memory 960 can store application data, user data, music, photos, documents, or other data, as well as system data (whether long-term or temporary) related to the execution of the applications and functions of system 900. In one embodiment, memory subsystem 960 includes memory controller 964 (which could also be considered part of the control of system 900, and could potentially be considered part of processor 910). Memory controller 964 includes a scheduler to generate and issue commands to control access to memory device 962.

Connectivity 970 includes hardware devices (e.g., wireless or wired connectors and communication hardware, or a combination of wired and wireless hardware) and software components (e.g., drivers, protocol stacks) to enable device 900 to communicate with external devices. The external device could be separate devices, such as other computing devices, wireless access points or base stations, as well as peripherals such as headsets, printers, or other devices. In one embodiment, system 900 exchanges data with an external device for storage in memory or for display on a display device. The exchanged data can include data to be stored in memory, or data already stored in memory, to read, write, or edit data.

Connectivity 970 can include multiple different types of connectivity. To generalize, device 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that device 900 could both be a peripheral device ("to" 982) to other computing devices, as well as have peripheral devices ("from" 984) connected to it. Device 900 commonly has a "docking" connector to connect to other computing devices for purposes such as managing (e.g., downloading, uploading, changing, synchronizing) content on device 900. Additionally, a docking connector can allow device 900 to connect to certain peripherals that allow device 900 to control content output, for example, to audiovisual or other systems.

In addition to a proprietary docking connector or other proprietary connection hardware, device 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Memory device 962 can be a memory device in accordance with any embodiment described herein. Memory device 962 includes mode registers (not specifically shown) that store configuration information for the memory device. In one embodiment, one or more of the mode registers has one type of access (read or write) that is faster than the other, where memory controller 964 can directly access for the one type of access, and for the other type it accesses via mode register mailbox 990. Mode register mailbox 990 represents a communication register in accordance with any embodiment disclosed herein. For example, for a read that is slower than a write, memory controller 964 can directly write a mode register and reads the mode register via mailbox register 990, in accordance with an embodiment described herein.

In one aspect, a memory device includes: a mode register to store configuration information, wherein a write of configuration information to the mode register by a host takes less time than a read of the configuration information from the mode register by the host; and a communication register separate from the mode register to provide data for a read of the configuration information by the host, wherein in response to a request by the host to read the mode register, the mode register to copy the configuration information from the mode register to the communication register, to enable the host to read the configuration information from communication register instead of directly from the mode register.

In one embodiment, the mode register comprises a decision feedback equalization (DFE) configuration mode register. In one embodiment, the memory device is to receive a polling request from the host after request by the host to read the mode register, to determine if the communication register is ready to read. In one embodiment, the host is to read the configuration information from the communication register after a preset period of time. In one embodiment, the communication register is shared among multiple separate mode registers as a mailbox to read the configuration information in turn from the multiple separate mode registers. In one embodiment, the communication register comprises a portion write-only for the host, to enable the host to write address information to identify one of the multiple separate mode registers to copy configuration information to the communication register. In one embodiment, the communication register comprises a portion read-only for the host, to enable the host to read configuration information from one of the multiple separate mode registers.

In one aspect, a system to read memory device configuration information includes a memory controller; and a memory device in accordance with any embodiment of the preceding two paragraphs. In one embodiment, the system further comprising one or more of: at least one processor communicatively coupled to the memory controller; a display communicatively coupled to at least one processor; or a network interface communicatively coupled to at least one processor.

In one aspect, a method for reading configuration information in a memory device, comprising: receiving a request from a host device to read a mode register that stores configuration information, wherein a write of the configuration information to the mode register by the host device takes less time than a read of the configuration information from the mode register by the host device; and copying the configuration information from the mode register into a communication register separate from the mode register to provide data for a read of the configuration information by the host in response to receiving the request, to enable the host to read the configuration information from communication register instead of directly from the mode register.

In one embodiment, further comprising receiving a polling request from the host after receiving the request to read the mode register, and to indicate if the communication register is ready to read in response to polling request. In one embodiment, copying the configuration information comprises guaranteeing that the configuration information is copied to the communication register within a preset period of time. In one embodiment, sharing the communication register among multiple separate mode registers as a mailbox to read the configuration information in turn from the multiple separate mode registers. In one embodiment, the communication register includes a portion write-only to the host device, and further comprising: reading address information written to the write-only portion by the host device to identify one of the multiple separate mode registers; and copying the configuration information to the communication register from the identified mode register in response to the request. In one embodiment, the communication register comprises a portion read-only for the host, and wherein copying the configuration information further comprises: copying to the communication register in the read-only portion. In one embodiment, the mode register comprises a decision feedback equalization (DFE) configuration mode register.

In one aspect, an apparatus comprising means for performing operations to execute a method in accordance with any embodiment of the preceding two paragraphs. In one aspect, an article of manufacture comprising a computer readable storage medium having content stored thereon to cause a machine to perform operations to execute a method in accordance with any embodiment of the preceding two paragraphs.

In one aspect, a memory controller includes: a scheduler to generate an access request to a mode register of a memory device, wherein the mode register has discrepancy between a read delay and a write delay; and input/output (I/O) hardware to access the mode register indirectly via a communication register instead of directly from the mode register.

In one embodiment, the access request comprises a read request, wherein a write of configuration information to the mode register takes less time than a read of the configuration information from the mode register. In one embodiment, the access request comprises a write request, wherein a read of configuration information from the mode register takes less time than a write of the configuration information to the mode register. In one embodiment, the scheduler is to generate a polling request after the access request, to determine if the communication register is ready to access. In one embodiment, the scheduler is to generate an operation to read the configuration information from the communication register after a preset period of time. In one embodiment, the communication register is shared among multiple separate mode registers as a mailbox to provide access to the multiple separate mode registers. In one embodiment, the communication register comprises a portion write-only for the memory controller, to enable the memory controller to write address information to identify one of the multiple separate mode registers to copy configuration information to the communication register. In one embodiment, the communication register comprises a portion read-only for the memory controller, to enable the memory controller to read configuration information from one of the multiple separate mode registers. In one embodiment, the mode register comprises a decision feedback equalization (DFE) configuration mode register.

In one aspect, a method for reading configuration information from a memory device includes: generating an access request to a mode register of a memory device, wherein the mode register has discrepancy between a read delay and a write delay; and access configuration information of the mode register indirectly via a communication register instead of directly accessing the mode register.

In one embodiment, the access request comprises a read request, wherein a write of configuration information to the mode register takes less time than a read of the configuration information from the mode register. In one embodiment, the access request comprises a write request, wherein a read of configuration information from the mode register takes less time than a write of the configuration information to the mode register. In one embodiment, further comprising: generating a polling request after the access request, to determine if the communication register is ready to access. In one embodiment, comprising: reading the configuration information from the communication register after a preset period of time. In one embodiment, the communication register is shared among multiple separate mode registers as a mailbox to provide access to the multiple separate mode registers. In one embodiment, the communication register comprises a portion write-only for a host, to enable writing address information to identify one of the multiple separate mode registers to copy configuration information to the communication register. In one embodiment, the communication register comprises a portion read-only for a host, to enable reading configuration information from one of the multiple separate mode registers. In one embodiment, the mode register comprises a decision feedback equalization (DFE) configuration mode register.

In one aspect, an apparatus comprising means for performing operations to execute a method in accordance with any embodiment of the preceding two paragraphs. In one aspect, an article of manufacture comprising a computer readable storage medium having content stored thereon to cause a machine to perform operations to execute a method in accordance with any embodiment of the preceding two paragraphs.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware or software or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device, comprising:
   a mode register to store configuration information to control operation of the memory device, wherein a write of configuration information directly to the mode register by a host takes less time than a read of the configuration information directly from the mode register by the host; and
   a communication register separate from the mode register to provide data for a read of the configuration information by the host from the mode register, wherein in response to a request by the host to read the mode register, the mode register to copy the configuration information from the mode register to the communication register, to enable the host to read the configuration information from the communication register instead of directly from the mode register.

2. The memory device of claim 1, wherein the mode register comprises a decision feedback equalization (DFE) configuration mode register.

3. The memory device of claim 1, wherein the memory device is to receive a polling request from the host after request by the host to read the mode register, to determine if the communication register is ready to read.

4. The memory device of claim 1, wherein the host is to read the configuration information from the communication register after a preset period of time.

5. The memory device of claim 1, wherein the communication register is shared among multiple separate mode registers as a mailbox to read the configuration information in turn from the multiple separate mode registers.

6. The memory device of claim 5, wherein the communication register comprises a portion write-only for the host, to enable the host to write address information to identify one of the multiple separate mode registers to copy configuration information to the communication register.

7. The memory device of claim 5, wherein the communication register comprises a portion read-only for the host, to enable the host to read configuration information from one of the multiple separate mode registers.

8. A system to read memory device configuration information, comprising:
   a memory controller; and
   a memory device including
   a mode register to store configuration information to control operation of the memory device, wherein a write of configuration information directly to the mode register by a host takes less time than a read of the configuration information directly from the mode register by the host; and
   a communication register separate from the mode register to provide data for a read of the configuration information by the host from the mode register, wherein in response to a request by the host to read the mode register, the mode register to copy the configuration information from the mode register to the communication register, to enable the host to read the configuration information from the communication register instead of directly from the mode register.

9. The system of claim 8, wherein the mode register comprises a decision feedback equalization (DFE) configuration mode register.

10. The system of claim 8, wherein the memory device is to receive a polling request from the host after request by the host to read the mode register, to determine if the communication register is ready to read.

11. The system of claim 8, wherein the host is to read the configuration information from the communication register after a preset period of time.

12. The system of claim 8, wherein the communication register is shared among multiple separate mode registers as a mailbox to read the configuration information in turn from the multiple separate mode registers.

13. The system of claim 12, wherein the communication register comprises a portion write-only for the host, to enable the host to write address information to identify one of the multiple separate mode registers to copy configuration information to the communication register.

14. The system of claim 12, wherein the communication register comprises a portion read-only for the host, to enable the host to read configuration information from one of the multiple separate mode registers.

15. The system of claim 8, further comprising one or more of:
    at least one processor communicatively coupled to the memory controller;
    a display communicatively coupled to at least one processor; or
    a network interface communicatively coupled to at least one processor.

16. A method for reading configuration information in a memory device, comprising:
    receiving a request from a host device to read a mode register that stores configuration information to control operation of the memory device, wherein a write of configuration information directly to the mode register by the host takes less time than a read of the configuration information directly from the mode register by the host device; and
    copying the configuration information from the mode register into a communication register separate from the mode register to provide data for a read of the configuration information by the host in response to receiving the request, to enable the host to read the configuration information from the communication register instead of directly from the mode register.

17. The method of claim 16, further comprising receiving a polling request from the host after receiving the request to read the mode register, and to indicate if the communication register is ready to read in response to polling request.

18. The method of claim 16, comprising sharing the communication register among multiple separate mode registers as a mailbox to read the configuration information in turn from the multiple separate mode registers.

19. The method of claim 18, wherein the communication register includes a portion write-only to the host device, and further comprising:
reading address information written to the write-only portion by the host device to identify one of the multiple separate mode registers; and
copying the configuration information to the communication register from the identified mode register in response to the request.

20. The method of claim 18, wherein the communication register comprises a portion read-only for the host, and wherein copying the configuration information further comprises:
copying to the communication register in the read-only portion.

21. A memory controller, comprising:
a scheduler to generate an access request to a mode register of a memory device, wherein the mode register has discrepancy between a read delay and a write delay for direct read access and direct write access; and
input/output (I/O) hardware to access the mode register indirectly via a communication register instead of directly from the mode register.

22. The memory controller of claim 21, wherein the access request comprises a read request, wherein a write of configuration information to the mode register takes less time than a read of the configuration information from the mode register.

23. The memory controller of claim 21, wherein the access request comprises a write request, wherein a read of configuration information from the mode register takes less time than a write of the configuration information to the mode register.

24. The memory controller of claim 21, wherein the scheduler is to generate a polling request after the access request, to determine if the communication register is ready to access.

25. The memory controller of claim 21, wherein the communication register is shared among multiple separate mode registers as a mailbox to provide access to the multiple separate mode registers.

* * * * *